United States Patent [19]

Leveille

[11] 4,334,758
[45] Jun. 15, 1982

[54] PLATE PROCESSOR

[75] Inventor: Joseph Leveille, Chappaqua, N.Y.

[73] Assignee: Polychrome Corporation, Yonkers, N.Y.

[21] Appl. No.: 252,732

[22] Filed: Apr. 10, 1981

[51] Int. Cl.³ .............................................. G03D 5/04
[52] U.S. Cl. .................................. 354/319; 354/325; 118/114; 118/411
[58] Field of Search ...................... 354/317, 319, 325; 118/109, 114, 316, 411; 134/64 P, 122 P

[56] References Cited

U.S. PATENT DOCUMENTS

| 3,641,911 | 2/1972 | Aelterman et al. | 134/64 P |
| 3,732,808 | 5/1973 | Graham | 354/319 |
| 3,774,521 | 11/1973 | Beck | 354/317 |
| 3,791,345 | 2/1974 | McCutcheon | 354/319 |
| 3,916,426 | 10/1975 | Bown | 354/319 |
| 4,222,656 | 9/1980 | Harrell et al. | 354/317 |

Primary Examiner—L. T. Hix
Assistant Examiner—Alan Mathews

[57] ABSTRACT

An improved apparatus for developing offset printing plates is disclosed, in which the soaker plates defining the developing chamber between them comprise textured stainless steel and are oriented at an angle to the horizontal, their upstream ends being higher than their downstream ends.

4 Claims, 2 Drawing Figures

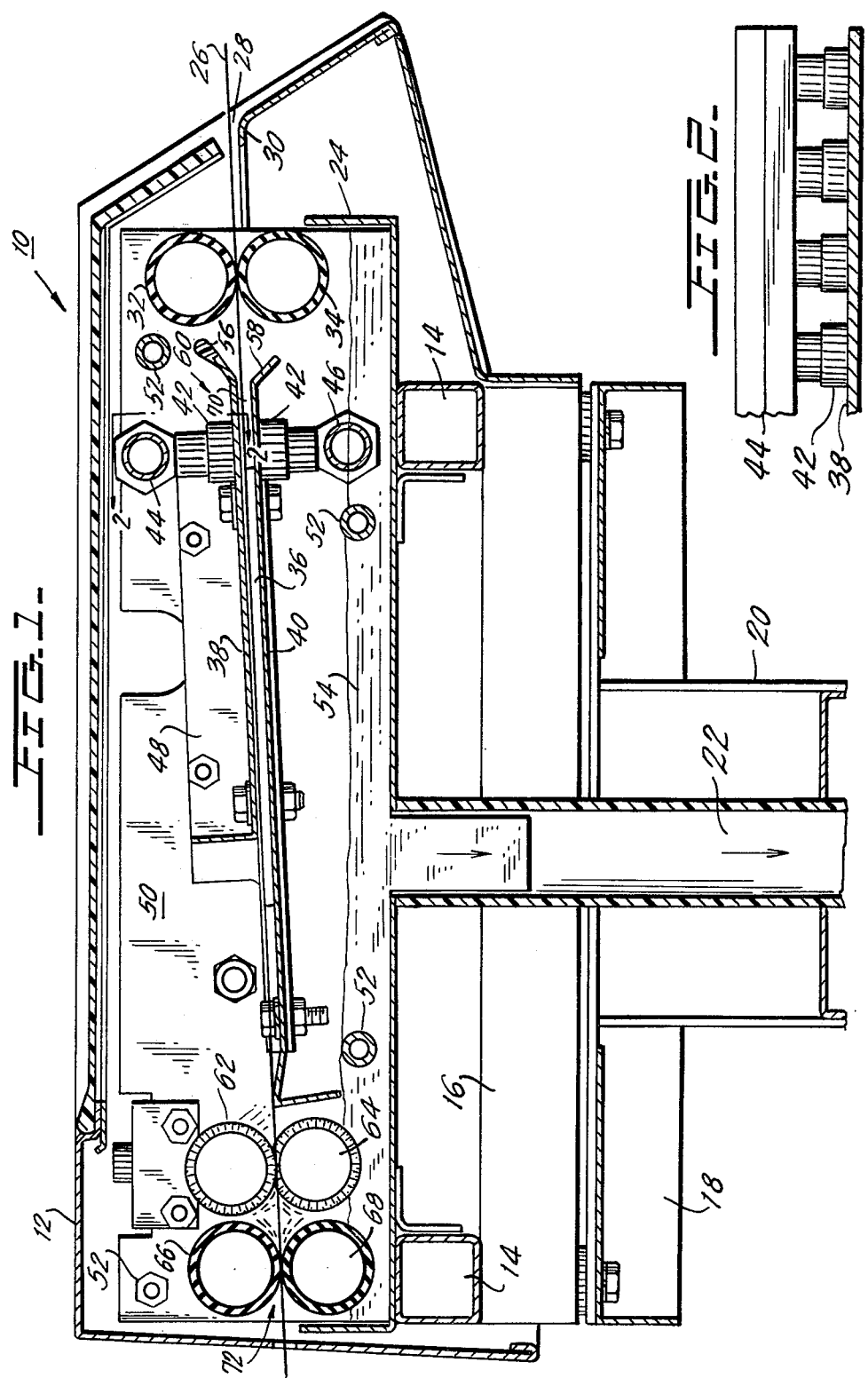

PLATE PROCESSOR

BACKGROUND OF THE INVENTION

The present invention pertains generally to a machine for preparing a planographic subtractive plate, such as a lithographic plate, for printing, and pertains more particularly to an improved processing machine in which a plate to be developed is passed by means of rollers through a developing station in which it is treated with developer.

Machines of this type are known, for example from U.S. Pat. No. 3,732,808, issued May 15, 1973, to Robert C. Graham for an APPARATUS FOR DEVELOPING OFFSET PRINTING PLATES, and U.S. Pat. No. 3,916,426, issued Oct. 28, 1975, to Delos E. Bown, also for an APPARATUS FOR DEVELOPING OFFSET PRINTING PLATES. Both of these patents are assigned to the assignee of the present application. The disclosure of each of these patents is hereby incorporated herein by reference.

In the machine disclosed in U.S. Pat. No. 3,732,808, a plate to be developed is fed horizontally between two rollers which feed it into a first developing station, where it is sprayed with a developer solution. From there it proceeds between two brush rollers, which feed it into a second developer chamber where it is again sprayed. After leaving the second developer chamber, it is squeegeed by passing between dryer rollers, which feed it out from the machine.

In the machine disclosed in U.S. Pat. No. 3,916,426, a plate is fed by means of rollers into a developing station where it is spread with developer. It is then fed sequentially through two pairs of scrubber brush rollers and then fed into a rinsing station, where it is sprayed with water or another suitable rinsing solution. After this it is fed by an additional set of rollers into a gumming station, where it is coated with a gumming solution to protect the non-printing portions of the plate during storage. From the gumming station, it is fed out through a drying station, where it is dried by means of warm air. It is then ejected from the machine by means of a delivery station.

Conventional developing apparatus, such as that described above, suffers from a number of problems. One of the most severe of these is that plates being developed are often scratched by contact with the rolls of the developing, or soaking, chamber. These walls, or soaker plates, are conventionally made of stainless steel, which can easily scratch the delicate surface of a lithographic or similar plate. Soaker plates also frequently adhere to a lithographic plate passing between them. This problem is especially severe with thin lithographic plates such as those of 0.004 and 0.006 gauge size.

Other problems also frequently occur in conventional developing machines. For example, it is often necessary to clean GAN (grain anodized) plates developed by means of such a machine. Other types of plates, especially WIN (smooth) and DSN (double sides smooth) plates, frequently jam while moving through the machine.

SUMMARY OF THE INVENTION

It is accordingly the principal object of the present invention to provide an improved machine for developing offset printing plates which will not scratch the plates being developed, and to which the plates being developed will not accidentally adhere.

It is another object of the invention to provide such a machine in which jamming of the plate being developed will not occur.

It is still another object of the invention to provide a machine of this type which can develop plates in such a manner as to obviate the need to clean the plates after they have been developed.

According to the present invention, these objects are attained by making the soaker plates of textured stainless steel rather than ordinary stainless steel, in order to prevent scratching and undesired adhesion. In addition, instead of being horizontal as in conventional machines, the soaker plates are oriented with a slight downstream incline, causing the developer solution to flow downstream over the surface of the plate being developed. The developer solution is sprayed onto the plate by several ports (preferably four) in each of the two soaker plates. Thus, each surface of the lithographic plate is sprayed by four streams of developer fluid, which then flows downstream across the plate surface. As a result of this novel design, it has been found that the problems described above are eliminated. In particular, the use of textured, rather than ordinary, stainless steel for the soaker plates eliminates scratching and sticking of the lithographic plate to the soaker plates because the use of textured stainless steel reduces the area of contact between the plate being developed and the soaker plates. The thorough spraying of each surface of the lithographic plate and the slant which the plate has as it passes between the inclined soaker plates permit the plate to be developed efficiently and uniformly with smaller total consumption of developer solution. In addition, it has been found that this design eliminates or greatly reduces jamming of plates and makes it unnecessary to clean the plates after development.

Other objects and features of the invention will be apparent from the following description of a preferred embodiment of the invention with reference to the accompanying drawings, in which:

BRIEF DESCRIPTION OF THE INVENTION

FIG. 1 is a schematic cross-sectional view of one type of plate developing apparatus constructed according to the principles of the present invention.

FIG. 2 is a view of the ports of one soaker plate as seen from line 2—2 of FIG. 1.

DETAILED DESCRIPTION OF THE PREFERRED EMBODIMENT

FIG. 1 shows a schematic cross-sectional view of a plate developing apparatus 10 constructed according to the principles of the present invention. The apparatus 10 is in a housing 12 and is mounted on a frame 14 mounted on a base 16, to which the housing 12 is preferably secured. The base 16 is secured to a table 18 having a central leg 20 through which a conduit for supplying developer solution extends. A tray 24 is mounted on the frame 14 and the conduit 22 communicates with the interior of the tray 24. A planographic printing plate 26, such as a lithographic plate, is inserted at the upstream end 28 of the apparatus 10 (the right hand end in FIG. 1) to be processed. In the developing apparatus 10 a developing solution is applied to the upper and lower surfaces of the plate, typically by spraying, although any other suitable means of application would be acceptable.

The plates which are developed by means of this machine are sensitized printing plates which have been exposed but not yet developed. The plate 26 is fed into the upstream end 28 of the machine 10, where it is supported on a supporting shelf 30 to align it as it enters the machine 10. As it enters, it is received between a pair of input rollers 32, 34, which support the plate 26 and guide it into a developing chamber 36 defined between parallel upper and lower soaker plates 38, 40. Each of the soaker plates 38, 40 is provided with a plurality of ports 42 through which a developing solution is sprayed onto the plate 26. In the embodiment shown, each soaker plate 38, 40 has four such ports 42 arranged in a transverse row as shown more clearly in FIG. 2, although the number of ports could be varied as desired.

A feeder 44 is provided to supply the developer chemical to the four ports 42 of the upper soaker plate 38, and a second feeder 46 is similarly provided for the lower soaker plate 40. The soaker plates 38, 40 and their associated feed lines 44, 46 and ports 42 are mounted by means of brackets 48 to side walls 50 (only one of which is shown) located at the sides of the photographic plate path. Tie bars 52 provide further support for the side walls 50. The tray 24, which serves as a reservoir for the developer solution 54, is disposed below the photographic plate path.

According to the invention, the soaker plates 38, 40 are slanted downstream at a predetermined angle that may lie in the range of 5°–10° and is preferably about 7°. At the upstream end of the developing chamber 36 are two flexible membranes 56, 58 which constitute a dam 60 that retains the developing solution in the developing chamber 36. The plate 26 is fed into the developing chamber 36 by the imput rollers 33, 34 which pass it between the two flexible membranes 56, 58 of the dam 60. As the plate 26 passes out of the developing chamber 36, it passes between a pair of scrubber brushes 62, 64. The scrubber brushes 62, 64 serve to spread the developer evenly on the plate 26 and to scrub it in thoroughly. The preferred construction of the scrubber brushes 62, 64 is described in detail in U.S. Pat. No. 3,916,426, referred to above. After being scrubbed by the scrubber brushes 62, 64, the plate 26 passes between a pair of exit rollers 66, 68, which squeegee excess developing solution from the plate 26 and feed the plate 26 out of the machine 10. The exit rollers 66, 68 also remove excess solution from the plate 26, returning the excess to the tray 24. One possible arrangement of the exit rollers 66, 68 and their associated equipment is described in greater detail in U.S. Pat. No. 3,916,426, referred to above. As noted, the scraped-off developing solution is caught in the tray 24, which is kept filled to a certain depth with the developing solution 54 in order to wet the scrubber brushes 62, 64 with it. It is desirable to keep the scrubber brushes 62, 64 moist in order to prevent the buildup of scale or precipitate thereon.

According to the present invention, the soaker plates 38, 40 of the developing chamber 36 are made, not of ordinary stainless steel, but of textured stainless steel. This prevents the lithographic plate 26 (especially a WIN, DSN or thin gauge, i.e. 0.004 inch to 0.006 inch, plate) from being scratched and also prevents it from adhering accidentally to one or both soaker plates 38, 40. This beneficial effect is due to the smaller area of contact between each soaker plate and the photographic plate obtained with textured stainless steel. The smaller contact area also reduces scratching.

In addition, as stated, the soaker plates 38, 40 are inclined at a slight angle to the horizontal, being slightly higher at their upstream end 70. As a result of this orientation, when a plate 26 is in the developing chamber 36, the solution applied to it flows evenly over its entire surface. This arrangement also aids in preventing sticking and scratching. It will be understood, naturally, that the path of the plate 26 should be a straight line from the point 28 at which it enters the machine 10 to the point 72 at which the plate 26 exits from the machine 10. Accordingly, the entire path of the plate 26 through the machine 10 is preferably oriented at the same angle to the horizontal as are the soaker plates 38, 40.

With this arrangement, the additional advantage is obtained that the lower input roller 34 can be kept above the level of the developer solution 54 in the tray 24. Because both input rollers 32, 34 are thus kept dry, they can exert a positive grip on the photographic plate 26, ensuring proper feed.

It has also been found that the textured stainless steel and inclined path cooperate to eliminate or at least greatly reduce the problem of plates jamming in the machine. This arrangement also obviates the need to clean plates after they have been developed. This is because the developer flows over the plate 26 for a longer time (typically 30 seconds) before passing between the scrubber brushes 62, 64 than in conventional apparatus, where the dwell time might typically be, for example, 20 seconds.

As a result of the use of textured stainless steel for the soaker plates, and also as a result of the novel inclined plate path employed in the machine described above, the problems encountered with conventional offset printing plate developing machines are greatly reduced or eliminated all together.

Although the present invention has been described in connection with a preferred embodiment thereof, many variations and modifications will now be apparent to those skilled in the art. The scope of the present invention is therefore to be limited not by the specific details of the preferred embodiment disclosed herein, but only by the appended claims.

What is claimed is:

1. An apparatus for developing offset printing plates, said apparatus comprising:

a developing station including two parallel soaker plates, made of textured stainless steel, defining a developing chamber between them, said soaker plates each having an upstream end and a downstream end and being inclined at a predetermined angle to the horizontal, said upstream end of each said soaker plate being higher than said downstream end thereof, and each said soaker plate having a plurality of ports disposed in a row transverse to the direction in which the printing plates move through said developing chamber whereby developing solution is sprayed on to each surface of the printing plates as they pass through said developing chamber;

reservoir means for containing a supply of developing solution;

means for delivering the developing solution from said reservoir means to the ports of said soaker plates; and feeding means for delivering a plate to said developing station.

2. The apparatus of claim 1 wherein each said row includes four equally spaced apart ports.

3. The apparatus of claim 1, wherein said predetermined angle lies in the range 5°–10°.

4. The apparatus of claim 3, wherein said predetermined angle is approximately 7°.

* * * * *